United States Patent
Ali et al.

(10) Patent No.: US 8,883,553 B2
(45) Date of Patent: Nov. 11, 2014

(54) INDEPENDENTLY CONTROLLED STACKED INVERTED ORGANIC LIGHT EMITTING DIODES AND A METHOD OF MANUFACTURING SAME

(71) Applicant: eMagin Corporation, Hopewell Junction, NY (US)

(72) Inventors: Tariq Ali, Hopewell Junction, NY (US); Amulkumar P. Ghosh, Beacon, NY (US); Ilyas Khayrullin, Flanders, NY (US)

(73) Assignee: eMagin Corporation, Hopewell Junction, NY (US)

( * ) Notice: Subject to any disclaimer, the term of this patent is extended or adjusted under 35 U.S.C. 154(b) by 69 days.

(21) Appl. No.: 13/648,163

(22) Filed: Oct. 9, 2012

(65) Prior Publication Data

US 2013/0033199 A1    Feb. 7, 2013

Related U.S. Application Data

(62) Division of application No. 12/897,109, filed on Oct. 4, 2010, now abandoned.

(51) Int. Cl.
*H01L 51/40* (2006.01)
*H01L 27/32* (2006.01)

(52) U.S. Cl.
CPC ......... *H01L 27/3209* (2013.01); *H01L 27/3244* (2013.01)
USPC .......... 438/99; 438/34; 438/35; 257/E51.018; 315/312

(58) Field of Classification Search
CPC ................................ H05B 37/00; H01L 51/56
USPC .......................... 257/40; 315/312; 438/34, 35
See application file for complete search history.

(56) References Cited

U.S. PATENT DOCUMENTS

| | | | | |
|---|---|---|---|---|
| 5,703,436 A | * | 12/1997 | Forrest et al. | 313/506 |
| 5,757,139 A | * | 5/1998 | Forrest et al. | 315/169.3 |
| 5,917,280 A | * | 6/1999 | Burrows et al. | 313/506 |
| 5,982,345 A | * | 11/1999 | Takayama et al. | 345/76 |
| 6,188,175 B1 | * | 2/2001 | May et al. | 313/504 |
| 6,320,322 B1 | * | 11/2001 | Tanaka | 315/169.3 |
| 6,566,806 B1 | * | 5/2003 | Kawai | 313/504 |
| 6,765,349 B2 | * | 7/2004 | Liao et al. | 313/504 |
| 6,872,472 B2 | * | 3/2005 | Liao et al. | 428/690 |
| 7,535,440 B2 | * | 5/2009 | Nishi et al. | 345/76 |
| 7,830,089 B2 | * | 11/2010 | Murano et al. | 313/506 |
| 8,207,665 B2 | * | 6/2012 | Ibe | 313/506 |
| 2002/0084993 A1 | * | 7/2002 | Taneya et al. | 345/204 |

(Continued)

*Primary Examiner* — Caleb Henry
(74) *Attorney, Agent, or Firm* — Epstein Drangel LLP; Robert L. Epstein

(57) ABSTRACT

An OLED apparatus is provided that includes a first electrode having a first polarity, and an electrode arrangement spaced apart from the first electrode and having a second polarity. The OLED apparatus also includes a first organic emissive layer interposed between the first electrode and the electrode arrangement, and a second electrode spaced apart from the electrode arrangement in a direction opposite the first electrode. The second electrode has the first polarity. The OLED apparatus further includes a second organic emissive layer interposed between the second electrode and the electrode arrangement, and a drive circuit for providing a first energizing signal to the first electrode and the electrode arrangement and a second energizing signal to the second electrode and the electrode arrangement. A method for manufacturing an OLED array is provided.

14 Claims, 4 Drawing Sheets

(56) References Cited

U.S. PATENT DOCUMENTS

| | | | |
|---|---|---|---|
| 2003/0170491 A1* | 9/2003 | Liao et al. | 428/690 |
| 2004/0119400 A1* | 6/2004 | Takahashi et al. | 313/504 |
| 2004/0183067 A1* | 9/2004 | Strip | 257/40 |
| 2005/0029933 A1* | 2/2005 | Liao et al. | 313/504 |
| 2005/0189875 A1* | 9/2005 | Nakada | 313/504 |
| 2006/0232992 A1* | 10/2006 | Bertram et al. | 362/555 |
| 2008/0130278 A1* | 6/2008 | Ushikubo et al. | 362/231 |
| 2008/0150846 A1* | 6/2008 | Chung | 345/80 |

* cited by examiner

INDEPENDENTLY CONTROLLED STACKED INVERTED ORGANIC LIGHT EMITTING DIODES AND A METHOD OF MANUFACTURING SAME

CROSS-REFERENCE TO RELATED APPLICATIONS

This application is a divisional application of patent application Ser. No. 12/897,109, filed Oct. 4, 2010, which claims the benefit of U.S. Provisional Application No. 61/278,304 filed Oct. 5, 2009, which are incorporated herein by reference.

STATEMENT REGARDING FEDERALLY SPONSORED RESEARCH OR DEVELOPMENT

Not Applicable

BACKGROUND OF THE INVENTION

1. Field of the Invention

The present invention relates to organic light emitting diodes (OLEDs). In particular, the present invention relates to a stack of inverted, independently controlled, OLEDs and a method of manufacturing a stack of inverted, independently controlled, OLEDs.

2. Description of Prior Art

An OLED device typically includes a stack of thin layers formed on a substrate. A light-emitting layer of a luminescent organic solid, as well as adjacent semiconductor layers, are sandwiched between a cathode and an anode. The light-emitting layer may be selected from any of a multitude of fluorescent and phosphorescent organic solids. Any of the layers, and particularly the light-emitting layer, also referred to herein as the emissive layer or the organic emissive layer, may consist of multiple sublayers.

In a typical OLED display, either the cathode or the anode is transparent or semitransparent. The films may be formed by evaporation, spin casting, chemical self-assembly or any other appropriate polymer film-forming techniques. Thicknesses typically range from a few monolayers (i.e., a single, closely packed layer of atoms or molecules, perhaps as thin as one molecule), up to about 1 to 2,000 angstroms.

Protection of an OLED display against oxygen and moisture can be achieved by encapsulation of the device. The encapsulation can be obtained by means of a single thin-film layer surrounding the OLED situated on the substrate.

High resolution active matrix displays may include millions of pixels and sub-pixels that are individually addressed by the drive electronics. The drive electronics for each sub-pixel can have several semiconductor transistors and other IC components. Each OLED may correspond to a pixel or a sub-pixel, and therefore these terms are used interchangeably hereinafter.

In an OLED device, one or more layers of semiconducting organic material are sandwiched between two electrodes. An electric current is applied across the device, causing negatively charged electrons to move into the organic material(s) from the cathode. Positive charges, typically referred to as holes, move in from the anode. The positive and negative charges meet in the center layers (i.e., the semiconducting organic material), combine, and produce photons. The wavelength—and consequently the color—of the photons depends on the electronic properties of the organic material in which the photons are generated.

The color of light emitted from the organic light emitting device can be controlled by the selection of the material used to form the emissive layer. White light may be produced by generating blue, red and green lights simultaneously. Other individual colors, different than red, green and blue, can be also used to produce in combination a white spectrum. The precise color of light emitted by a particular structure can be controlled both by selection of the organic material, as well as by selection of dopants in the organic emissive layers. Alternatively, filters of red, green or blue (or other colors), may be added on top of a white light emitting pixel. In further alternatives, white light emitting OLED pixels may be used in monochromatic displays.

Pixel drivers can be configured as either current sources or voltage sources to control the amount of light generated by the OLEDs in an active matrix display.

BRIEF SUMMARY OF THE INVENTION

An inverted tandem structure for two OLEDs is provided, which may share a common electrode. The two OLEDs have a reflective anode on one side and a transparent anode on the other side adjacent to a glass substrate. In the middle of the inverted tandem structure is a common, transparent cathode.

A light emitting apparatus is provided that includes first and second OLED devices. The first OLED device is stacked and inverted relative to the second OLED device. The light emitting apparatus includes the first OLED device, which includes a first electrode having a first polarity and a first organic emissive layer. The light emitting apparatus also includes the second OLED device, which includes a second electrode having the first polarity and a second organic emissive layer. The light emitting apparatus further includes electrode means having a second polarity interposed between the first organic emissive layer and the second organic emissive layer. The first organic emissive layer is interposed between the first electrode and the electrode means, and the second organic emissive layer is interposed between the second electrode and the electrode means. Also included in the light emitting apparatus are driving means for independently driving the first OLED device and the second OLED device. The driving means include means for providing a first energizing signal to the first electrode and the electrode means, and means for providing a second energizing signal to the second electrode and the electrode means.

In the light emitting apparatus, the electrode means may include a single central electrode. The first electrode may be a first anode, the second electrode may be a second anode, and the single central electrode may be a cathode with respect to the first OLED device and the second OLED device. The first OLED device may include a hole injection layer interposed between the first organic emissive layer and the first anode, and a hole transport layer interposed between the first organic emissive layer and the hole injection layer. The first OLED device may also include a hole blocking layer interposed between the first organic emissive layer and the single central electrode, and an electron injection layer interposed between the hole blocking layer and the single central electrode. The second OLED device may include an electron transport layer interposed between the second emissive layer and the single central electrode, and a hole blocking layer interposed between the second emissive layer and the second electrode. The second OLED device may also include a hole transport layer interposed between the hole blocking layer and the second electrode, and a hole injection layer interposed between the hole transport layer and the second electrode.

The first electrode may be a first cathode, the second electrode may be a second cathode, and the single central electrode may be an anode with respect to the first OLED device and the second OLED device.

The electrode means may include a first central electrode associated with the first OLED device and a second central electrode associated with the second OLED device. The first electrode may be a first anode, the first central electrode may be a first cathode, the second electrode may be a second anode, and the second central electrode may be a second cathode.

The first electrode may be a first cathode, the first central electrode may be a first anode, the second electrode may be a second cathode, and the second central electrode may be a second anode.

The first OLED device or the second OLED device may emit blue light, and the first OLED device or the second OLED device may be a hybrid OLED device that emits a combination of red light and green light.

The driving means may be capable of independently energizing the first OLED device and the second OLED device so that light emitted from the first OLED device and the second OLED device combines to form white light.

The light emitting apparatus may further include a third OLED device stacked on the first OLED device or the second OLED device.

An OLED apparatus is provided that includes a first electrode having a first polarity, and an electrode arrangement spaced apart from the first electrode and having a second polarity. The OLED apparatus also includes a first organic emissive layer interposed between the first electrode and the electrode arrangement, and a second electrode spaced apart from the electrode arrangement in a direction opposite the first electrode. The second electrode has the first polarity. The OLED apparatus further includes a second organic emissive layer interposed between the second electrode and the electrode arrangement, and a drive circuit for providing a first energizing signal to the first electrode and the electrode arrangement and a second energizing signal to the second electrode and the electrode arrangement.

The first electrode may be a first anode for the first organic emissive layer, the electrode arrangement may be a common cathode for the first organic emissive layer and the second organic emissive layer, and the second electrode may be a second anode for the second organic emissive layer.

The first electrode may be a first cathode for the first organic emissive layer, the electrode arrangement may be a common anode for the first organic emissive layer and the second organic emissive layer, and the second electrode may be a second cathode for the second organic emissive layer.

The electrode arrangement may include a first interior electrode and a second interior electrode. The first interior electrode may be associated with the first organic emissive layer and the second interior electrode may be associated with the second organic emissive layer.

The first electrode may be a first anode for the first organic emissive layer, the first interior electrode may be a first cathode for the first organic emissive layer, the second interior electrode may be a second cathode for the second organic emissive layer, and the second electrode may be a second anode for the second organic emissive layer.

The first electrode may be a first cathode for the first organic emissive layer, the first interior electrode may be a first anode for the first organic emissive layer, the second interior electrode may be a second anode for the second organic emissive layer, and the second electrode may be a second cathode for the second organic emissive layer.

A method for manufacturing an organic light emitting diode (OLED) array is provided that includes forming a first electrode layer, forming a first emissive layer above the first electrode layer, and forming a conductive layer above the first emissive layer. The method also includes forming a second emissive layer above the conductive layer, forming a second electrode layer above the second emissive layer, and connecting first drive circuitry to the first electrode layer and the conductive layer. The first drive circuitry is configured to energize the first emissive layer. The method further includes connecting second drive circuitry to the second electrode layer and the conductive layer. The second drive circuitry is configured to energize the second emissive layer. The first drive circuitry and the second the drive circuitry are configured to operate independently.

DETAILED DESCRIPTION OF THE INVENTION

In the following description, the following acronyms may be used: hole blocking layer—HBL; hole injection layer—HIL; hole transport layer—HTL; electron injection layer—EIL; emissive layer—EML; electron transport layer—ETL; and indium tin oxide—ITO. Furthermore, CIE coordinates refer to standards promulgated by the International Commission on Illumination specifying color/chromaticity by position on a CIE chart.

The organic material in an OLED device may include organo-metallic chelates (for example, $Alq_3$), conjugated dendrimers, poly(p-phenylene vinylene) and polyfluorene, or their derivatives, or any other appropriate organic material. The term electrode is referred to herein as a generic term encompassing both anodes and cathodes.

An exemplary embodiment of a stacked OLED device has independent drive circuitry for at least two distinct OLED layers and provides a phosphorescent white OLED. CIEs vary with current density, and an exemplary OLED device may reduce and/or eliminate color shift with changing current density by varying the voltage applied to the two inverted and stacked OLED devices. A shift in CIE color coordinates may be observed in phosphorescent OLEDs due to an imbalance in the charge carriers. The structure shown in FIG. 1 reduces and/or eliminates the color shift issue by separating the two emitter layers, namely, the phosphorescent blue layer and combining the phosphorescent red and green emitters in a common host. In other exemplary embodiments, a hybrid structure is provided where fluorescent blue can be combined with phosphorescent green/red emitters.

Exemplary embodiments provide a transparent stackable OLED structure with independent control of each of the stacked individual OLEDs. Exemplary embodiments provide an inverted tandem structure with phosphorescent blue and red/green emitters, thereby eliminating color shift at gray levels.

Figure 1:
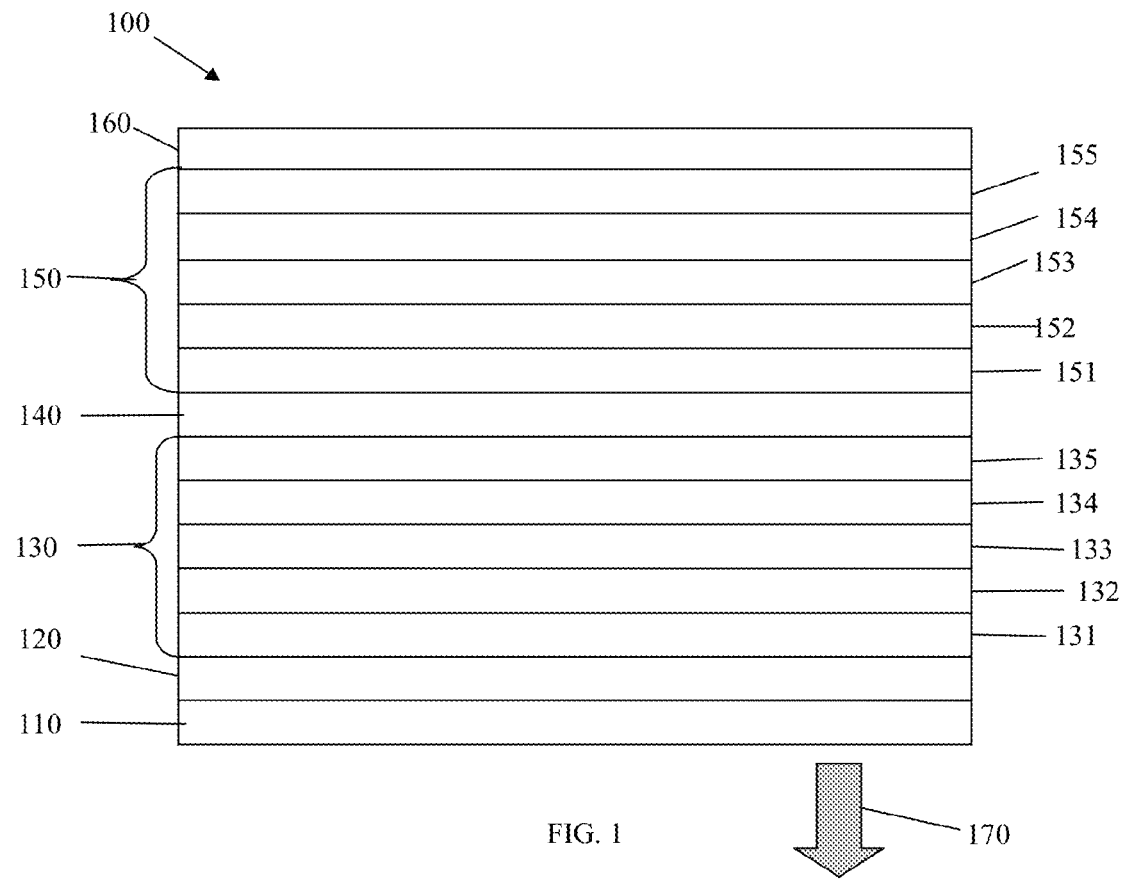
FIG. 1 is a schematic cross-sectional view of an OLED device in accordance with an exemplary embodiment.

FIG. 1 is a schematic cross-sectional view of OLED device 100 in accordance with an exemplary embodiment including an inverted tandem structure. OLED device 100 shown in the schematic includes a reflective top anode (second anode 160) and a transparent bottom anode (first anode 120) on a glass substrate (transparent substrate 110) with a transparent cathode (cathode 140) between two OLED units (first OLED intermediate layers 130 and second OLED intermediate layers 150). Alternatively, the cathode discussed herein may be an anode, and the anodes may instead by cathodes.

FIG. 1 illustrates schematically OLED device 100. The terms above, below, top and bottom are relative terms used with respect to FIG. 1, and do not preclude the structure of OLED device 100 being inverted or oriented in any other possible way.

OLED device 100 includes first OLED intermediate layers 130 and second OLED intermediate layers 150 arranged in an inverted stacked arrangement. On top of OLED device 100, above second OLED intermediate layers 150, may be arranged second anode 160, which may be reflective in order to maximize light output 170 emitted at an opposite side of OLED device 100. Arranged between second OLED intermediate layers 150 and first OLED intermediate layers 130 may be cathode 140, which may be transparent or translucent. Below first OLED intermediate layers 130 may be first anode 120, which may include ITO. Below first anode 120, at a bottom of OLED device 100, may be arranged transparent substrate 110, which may be glass or any other appropriate material.

First OLED intermediate layers 130 may output blue light when energized, and may include various sublayers. Arranged below cathode 140 may be first EIL 135, which may be arranged on top of first HBL 134. First HBL 134 may be arranged on top of first EML 133, which may in turn be arranged on top of first HTL 132. First HTL 132 may be arranged on top of first HIL 131, which may in turn be arranged on top of first anode 120. First EML 133 may be doped or otherwise formed in order that a blue light is emitted in a fluorescent or phosphorescent reaction when a positive voltage is applied to first anode 120 with respect to cathode 140. Alternatively, first OLED intermediate layers 130 may be driven by a current driver rather than by a voltage. In further alternatives, the order of the layers may be reversed, and/or the anode may be a cathode and the cathode may be an anode.

Second OLED intermediate layers 150 may output red, green light, and/or orange light, and may include various sublayers. Arranged below second anode 160 may be second HIL 155, which may be arranged on top of second HTL 154. Second HTL 154 may be situated on top of second EML 153, which may in turn be arranged on top of second HBL 152. Second HBL 152 may be arranged on top of first ETL 151, which may in turn be arranged on top of cathode 140. Second EML 153 may be doped or otherwise formed in order that a combination of red and green light is emitted in a phosphorescent reaction when a positive voltage is applied to second anode 160 with respect to cathode 140. Alternatively, second OLED intermediate layers 150 may be driven by a current driver rather than by a voltage. In further alternatives, the order of the layers may be reversed, and/or the anode may be a cathode and the cathode may be an anode.

OLED device 100 may be formed in several possible ways, including building up layers from a bottom layer, which may be a top layer after inverting the entire stack. In this case, the first layer deposited may be second anode 160, on a bottom and continuing up to transparent substrate 110. After the forming the layers from top to bottom, the entire stack may be inverted to cause light output 170 to be directed downwards, as shown in FIG. 1.

Alternative manufacturing methods may provide for first OLED intermediate layers 130 and second OLED intermediate layers 150 to be formed as separate OLED devices and then combined by inverting one of the two OLED devices with respect to the other OLED device, and then stacking the two devices together. In this situation, one of the OLED devices may not include a cathode or anode on the side contacting the other OLED device, or alternatively, the two cathodes or anodes of the devices positioned adjacent following the inversion and stacking may combine to form one cathode or anode.

Alternative layering combinations are possible in OLED device 100, and in particular different combinations of OLED devices are able to be stacked in exemplary embodiments. For instance, more than two OLED devices may be stacked in exemplary embodiments, in which the additional OLED devices share electrodes or have separate electrodes which are insulated from adjacent electrodes. These additional OLEDs may be energized independently or may be connected in parallel with one of the two OLEDs of OLED device 100. Furthermore, other combinations of single color and hybrid OLED devices are possible, depending on the desired output of OLED device 100. Additionally, other OLED apparatuses may be stacked adjacent to OLED device 100 and the combination of the stacked OLED devices of OLED device 100 and the single or stacked OLED devices of the adjacent OLED apparatuses may together provide a desired light output.

Figure 2A:
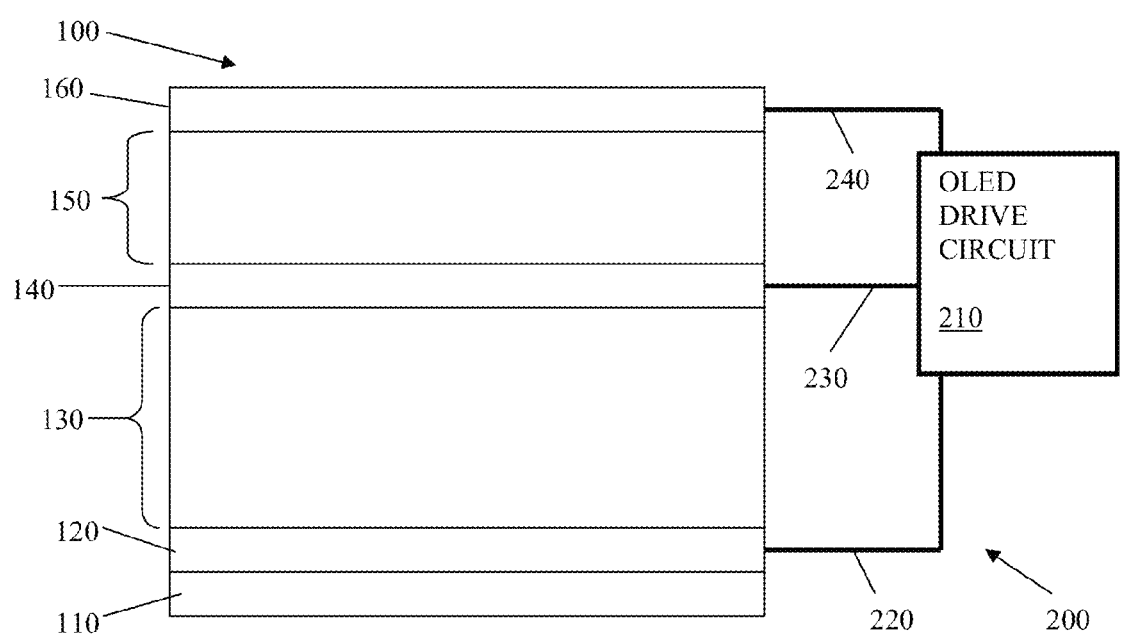
FIG. 2a is a schematic cross-sectional of the OLED device of FIG. 1 including a drive circuit.

FIG. 2a is a schematic cross-sectional view of OLED device 100 of FIG. 1 including OLED drive circuit 210. FIG. 2a shows OLED device 100 in a simplified form, including none of the sublayers of first OLED intermediate layers 130 and second OLED intermediate layers 150. OLED device 100 and OLED drive circuit 210 together form driven OLED system 200. OLED drive circuit 210 includes 3 leads extending to OLED device 100, namely leads 220, 230 and 240. Lead 220 couples OLED drive circuit 210 to first anode 120, lead 230 couples OLED drive circuit 210 to cathode 140, and lead 240 couples OLED drive circuit 210 to second anode 160. Alternatively, as discussed above, first anode 120 and second anode 160 may be cathodes, and cathode 140 may be an anode. Additionally or alternatively, lead 230 leading from OLED drive circuit 210 to cathode 140 may be two leads, which may at the same or different voltages, or may be carrying the same or different currents, and which may couple to two anodes or two cathodes. In a particular embodiment, lead 230 may be at ground, while leads 220 and 240 may be at different voltages.

OLED drive circuit 210 may operate to control the voltages, or currents, on leads 220 and 240 to independently drive first OLED intermediate layers 130 and second OLED intermediate layers 150. OLED drive circuit 210 may be two independent voltage or current sources, which may be manually, automatically, or computer controlled to provide a voltage or current on leads 220 and 240. The independent control of first OLED intermediate layers 130 and second OLED intermediate layers 150 may enable better white balance in the case that one of first and second OLED devices is a blue OLED and the other of the first and second OLED devices is a red/green hybrid OLED. Alternative purposes for independently driving first and second OLED devices are possible.

Figure 2B:
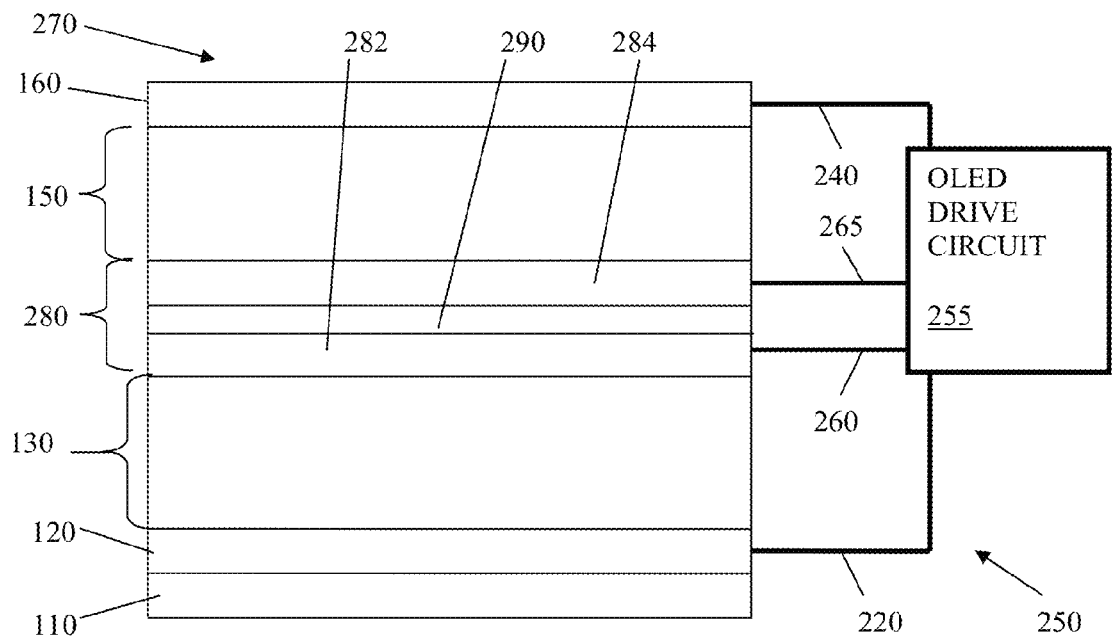
FIG. 2b is a schematic cross-sectional of an OLED device including a drive circuit and an alternative central electrode arrangement.

FIG. 2b is a schematic cross-sectional of OLED device 270 including OLED drive circuit 255 and central electrode arrangement 280. FIG. 2b shows OLED device 270 in a simplified form, including none of the sublayers of first OLED intermediate layers 130 and second OLED intermediate layers 150. OLED device 270 and OLED drive circuit 255 together form driven OLED system 250. OLED drive circuit 255 includes 4 leads extending to OLED device 270, namely leads 220, 260, 265, and 240. Lead 220 couples OLED drive circuit 255 to first anode 120, lead 260 couples OLED drive circuit 255 to first interior cathode 282, lead 265 couples OLED drive circuit 255 to second interior cathode 284, and lead 240 couples OLED drive circuit 255 to second anode 160. Alternatively, as discussed above, first anode 120 and second anode 160 may be cathodes, and first interior cathode 282 and second interior cathode 284 may be anodes. As mentioned above, lead 260 and lead 265 may at the same or different voltages, or may be carrying the same or different currents. In a particular embodiment, lead 260 and lead 265 may be at ground, while leads 220 and 240 may be at different voltages.

OLED drive circuit 255 may operate to control the voltages, or currents, on leads 220 and 240 to independently drive first OLED intermediate layers 130 and second OLED intermediate layers 150. First interior cathode 282 and second interior cathode 284 may be separated by insulation layer 290, which may be composed of, for example, a non-conducting oxide or nitride layer. In the case that central electrode arrangement 280 includes insulation layer 290, first interior cathode 282 and second interior cathode 284 may have different voltage potentials, and/or may carry different currents. In cases where insulation layer 290 is absent, first interior cathode 282 and second interior cathode 284 may be electrically coupled.

Pixel drivers can be configured as either current sources or voltage sources to control the amount of light generated by the OLEDs in an active matrix display. OLEDs have typically been driven in current mode due to the linear dependence of luminance on operating current. Driving OLEDs in voltage mode, on the other hand, may not be used due to the nonlinear voltage to luminance behavior of the OLED which varies under different operating conditions. A voltage drive mode may enable miniaturization of the pixel cell while still providing good control for low light applications. The threshold voltage compensation techniques may be one of two types: 1) voltage based compensation using a second storage capacitor to store the threshold voltage at each pixel; and 2) current based compensation.

Figure 3:
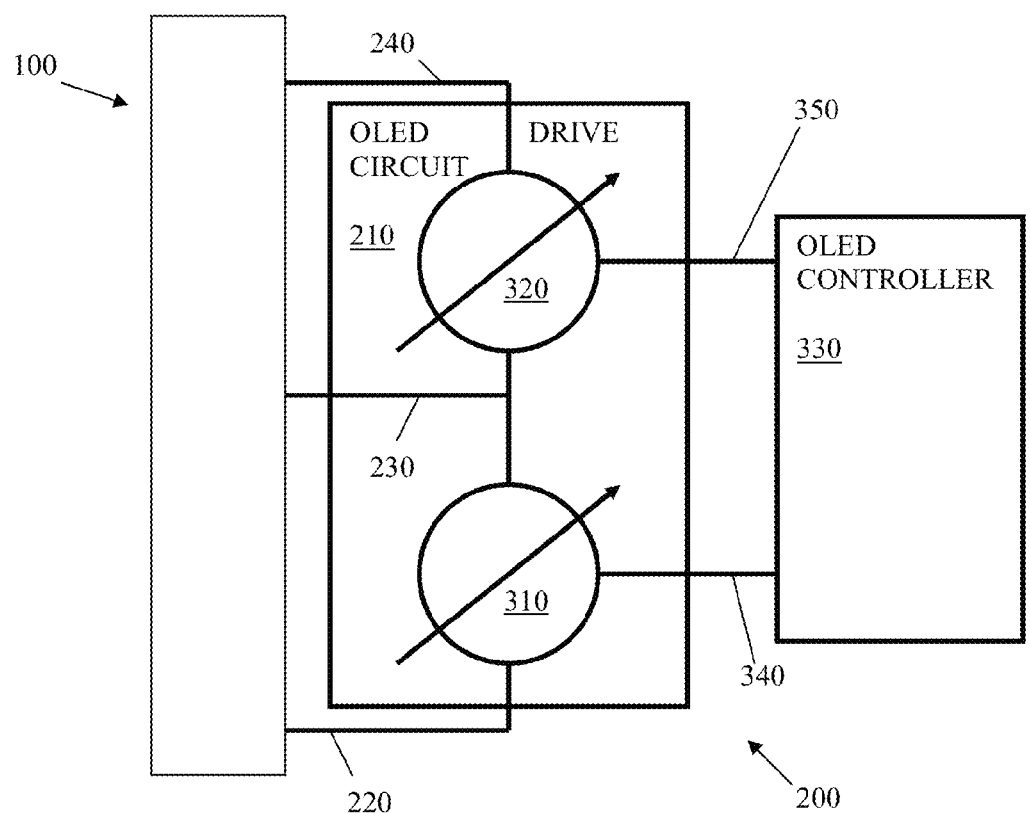
FIG. 3 is a schematic view of the OLED device of FIG. 1 including a drive circuit, an OLED controller and additional detail of the drive circuitry.

FIG. 3 is a schematic view of OLED device 100 of FIG. 1 including OLED drive circuit 210, OLED controller 330 and additional detail of the drive circuitry. In particular, OLED drive circuit 210 is illustrated as including two variable sources 310, 320. Variable sources 310, 320 may be voltage sources or current sources. Variable source 310 is connected to lead 220 and lead 230. Variable source 320 is connected to lead 240 and lead 230. Alternatively, variable sources 310, 320 may not have a common lead 230, but instead have separate leads for energizing different OLED layers of OLED device 100. Variable source 310 is controlled by a data signal on data line 340 from OLED controller 330. Variable source 320 is controlled by a data signal on data line 350 from OLED controller 330. OLED controller 330 may be a processor or computer.

Figure 4:
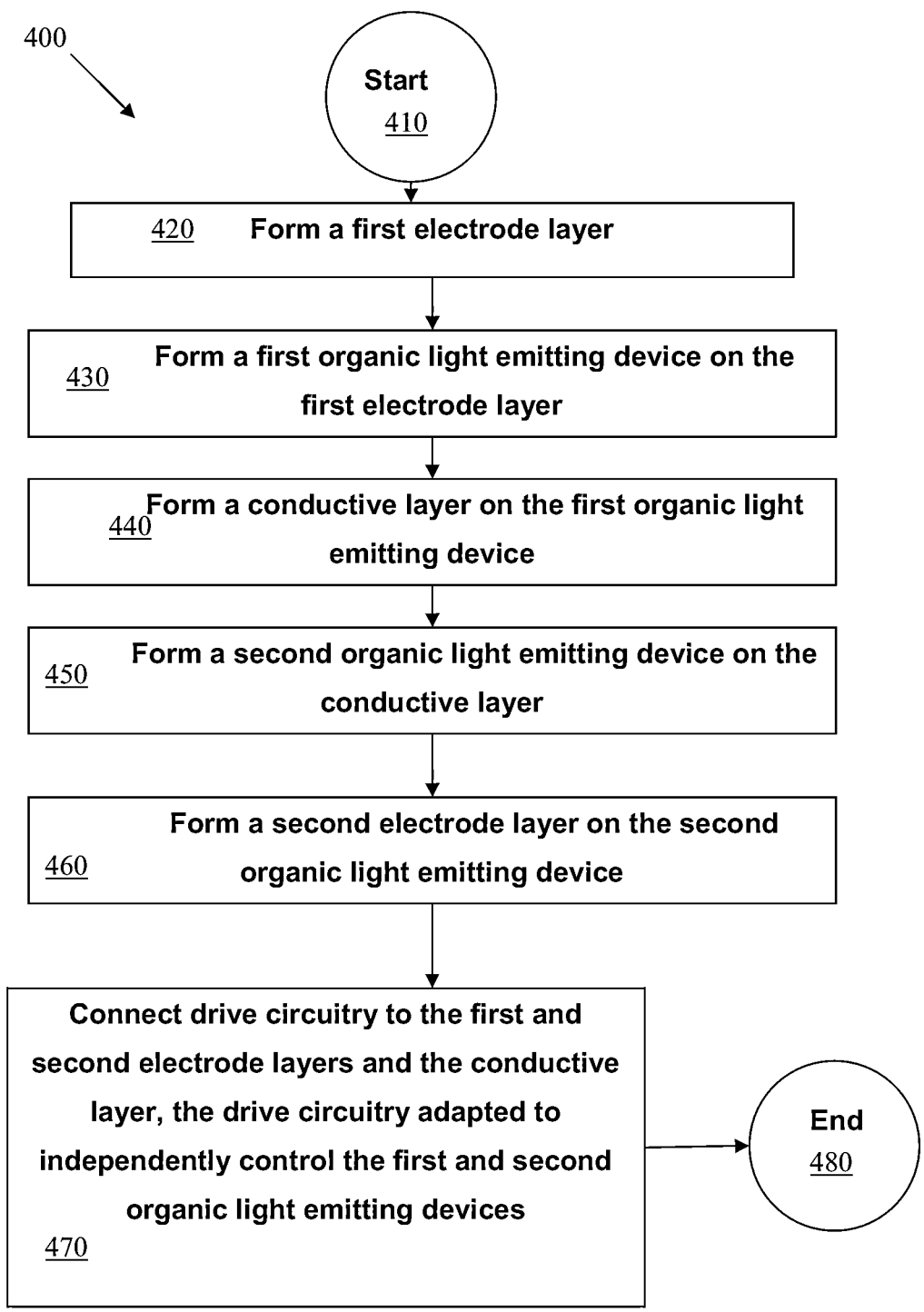
FIG. 4 illustrates a method according to an exemplary embodiment.

FIG. 4 illustrates method 400 according to an exemplary embodiment. Method 400 starts at start circle 410 and proceeds to operation 420, which indicates to form a first electrode layer. From operation 420 the flow in method 400 proceeds to operation 430, which indicates to form a first organic light emitting device on the first electrode layer. From operation 430 the flow in method 400 proceeds to operation 440, which indicates to form a conductive layer on the first organic light emitting device. From operation 440 the flow in method 400 proceeds to operation 450, which indicates to form a second organic light emitting device on the conductive layer. From operation 450 the flow in method 400 proceeds to operation 460, which indicates to form a second electrode layer on the second organic light emitting device. From operation 460 the flow in method 400 proceeds to operation 470, which indicates to connect drive circuitry to the first and second electrode layers and the conductive layer. The drive circuitry is adapted to independently control the first and second organic light emitting devices. From operation 470, the flow proceeds to end circle 480.

The manufacturing method may further include providing a transparent substrate on a side of the first electrode layer opposite the first emissive layer. This transparent substrate may be provided before operation 420, and the first electrode layer may be formed on this transparent substrate. Alternatively, the transparent substrate may be provided on a side of the second electrode layer opposite the second emissive layer. When the transparent substrate is provided on the side of the first electrode layer opposite the first emissive layer, the second electrode layer may be reflective. When the transparent substrate is provided on the side of the second electrode layer opposite the second emissive layer, the first electrode layer may be reflective.

The light emitting apparatus may also include a transparent substrate arranged either 1) on the first electrode on a side opposite a first organic light emissive layer, or 2) on the second electrode on a side opposite a second organic light emissive layer.

The method for manufacturing an organic light emitting diode (OLED) array may include applying a surface layer to the array of OLEDs, for instance for the purpose of sealing the OLED array or filtering the light emitted from the OLED array. The layers in a complete OLED array may be deposited or arranged in any appropriate manner, including vacuum deposition, thermal evaporation, vapor deposition, printing, and/or spin coating.

Figure 5:
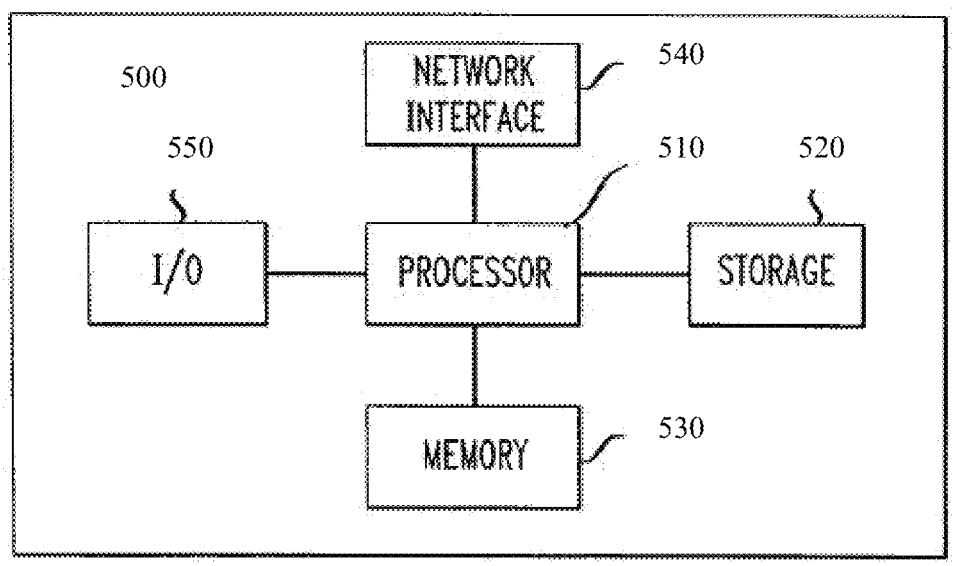
FIG. 5 illustrates a computer system according to an exemplary embodiment.

FIG. 5 illustrates a computer system according to an exemplary embodiment. Computer 500 can, for example, operate OLED drive circuit 210, or OLED controller 330, or may be OLED controller 330. Additionally, computer 500 can perform the steps described above (e.g., with respect to FIG. 4). Computer 500 contains processor 510 which controls the operation of computer 500 by executing computer program instructions which define such operation, and which may be stored on a computer-readable recording medium. The computer program instructions may be stored in storage 520 (e.g., a magnetic disk, a database) and loaded into memory 530 when execution of the computer program instructions is desired. Thus, the computer operation will be defined by computer program instructions stored in memory 530 and/or storage 520 and computer 500 will be controlled by processor 510 executing the computer program instructions. Computer 500 also includes one or more network interfaces 540 for communicating with other devices, for example other computers, servers, or websites. Network interface 540 may, for example, be a local network, a wireless network, an intranet, or the Internet. Computer 500 also includes input/output 550, which represents devices which allow for user interaction with the computer 500 (e.g., display, keyboard, mouse, speakers, buttons, webcams, etc.). One skilled in the art will recognize that an implementation of an actual computer will contain other components as well, and that FIG. 5 is a high level representation of some of the components of such a computer for illustrative purposes.

While only a limited number of preferred embodiments of the present invention have been disclosed for purposes of illustration, it is obvious that many modifications and variations could be made thereto. It is intended to cover all of those modifications and variations which fall within the scope of the present invention, as defined by the following claims.

We claim:

1. A method for manufacturing an organic light emitting diode (OLED) array, comprising:
   forming a first electrode layer;
   forming a first OLED including a first emissive layer above the first electrode layer;
   forming a conductive layer, said first OLED being situated above the conductive layer without an insulating layer therebetween;
   forming a second OLED including a second emissive layer above the conductive layer without an insulating layer therebetween;
   forming a second electrode layer above the second emissive layer;
   forming first drive circuitry;
   forming second drive circuitry;
   connecting first drive circuitry to the first electrode layer and the conductive layer, the first drive circuitry configured to energize the first emissive layer; and
   connecting second drive circuitry to the second electrode layer and the conductive layer, the second drive circuitry configured to energize the second emissive layer;
   providing separate control signals to the first drive circuitry and the second drive circuitry such that the first drive circuitry and the second the drive circuitry are capable of operating independently to energize the first emissive layer and the second emissive layer.

2. The method of claim 1 wherein the step of forming a conductive layer comprises the step of forming a single central electrode.

3. The method of claim 2 wherein: the step of forming a first electrode layer comprises the step of forming a first anode; wherein the step of forming a second electrode layer comprises the step of forming a second anode.

4. The method of claim 2 wherein the step of forming a single central electrode comprises the step of forming a single central cathode.

5. The method of claim 1 further comprising the steps of: forming a hole injection layer between the first emissive layer and the first electrode layer; forming a hole transport layer between the first emissive layer and the hole injection layer; forming a hole blocking layer between the first emissive layer and the conductive layer; and forming an electron injection layer between the hole blocking layer and the conductive layer.

6. The method of claim 1 further comprising the steps of: forming an electron transport layer between the second emissive layer and the conductive layer; forming a hole blocking layer between the second emissive layer and the second electrode layer; forming a hole transport layer between the hole blocking layer and the second electrode layer; and forming a hole injection layer between the hole transport layer and the second electrode layer.

7. The method of claim 2 wherein: the step of forming a first electrode layer comprises the step or forming a first cathode; wherein the step of forming a second electrode layer comprises the step of forming a second cathode.

8. The method of claim 2 wherein the step of forming a single central electrode comprises the step of forming a single central anode.

9. The method of claim 1 wherein the step of forming as conductive layer comprises forming a first central electrode and forming a second central electrode.

10. The method of claim 9, wherein the step of forming the first central electrode comprises forming a first cathode and wherein the step of forming the second central electrode comprises the step of forming a second cathode.

11. The method of claim 9, wherein the step of forming the first central electrode comprises forming a first anode and wherein the step of forming the second central electrode comprises the step of forming a second anode.

12. The method of claim 1 wherein the step of forming the first emissive layer and the step of forming the second emissive layer comprises the step of forming an emissive layer which emits blue light.

13. The method of claim 1 wherein the step of forming the first emissive layer and the step of forming the second emissive layer comprises the step of forming an emissive layer which emits a combination of red light and green light.

14. The method of claim 1 wherein the step of connecting first drive circuitry and the step of connecting the second drive circuitry comprises the step of connecting first drive circuitry and second drive circuitry such that the organic light emitting diode emits white light.

* * * * *